(12) United States Patent
Sharma et al.

(10) Patent No.: US 12,206,965 B2
(45) Date of Patent: Jan. 21, 2025

(54) SVVRON EFFECT: 3D TV AND CAMERA (WITHOUT GLASSES)

(71) Applicants: Vibha Sharma, Singapore (SG); Nishant Sharma, Singapore (SG)

(72) Inventors: Vibha Sharma, Singapore (SG); Nishant Sharma, Singapore (SG)

(*) Notice: Subject to any disclaimer, the term of this patent is extended or adjusted under 35 U.S.C. 154(b) by 92 days.

(21) Appl. No.: 17/907,163

(22) PCT Filed: Apr. 18, 2020

(86) PCT No.: PCT/SG2020/050209
§ 371 (c)(1),
(2) Date: Sep. 23, 2022

(87) PCT Pub. No.: WO2021/201770
PCT Pub. Date: Oct. 7, 2021

(65) Prior Publication Data
US 2023/0107059 A1    Apr. 6, 2023

(30) Foreign Application Priority Data
Mar. 30, 2020 (SG) .......................... 10202002922R (51) Int. Cl.
*H04N 23/53*     (2023.01)
*H04N 23/56*     (2023.01)
*H04N 25/702*    (2023.01)

(52) U.S. Cl.
CPC ............ *H04N 23/53* (2023.01); *H04N 23/56* (2023.01); *H04N 25/702* (2023.01)

(58) Field of Classification Search
CPC ...... H04N 23/53; H04N 23/56; H04N 25/702; H04N 13/243; H04N 23/55;
(Continued)

(56) References Cited

U.S. PATENT DOCUMENTS

| 4,271,408 A | 6/1981 | Teshima et al. |
| 10,616,547 B1 * | 4/2020 | Chapman ........... G03B 21/2033 |

(Continued)

FOREIGN PATENT DOCUMENTS

| CN | 104123893 A | 10/2014 |
| CN | 204087718 U | 1/2015 |

OTHER PUBLICATIONS

Applicant: Nishant Sharma; International Application No. PCT/SG2020/050209 Filed Apr. 18, 2020; PCT International Search Report and Written Opinion dated Sep. 22, 2020; 9 pgs.

*Primary Examiner* — Albert H Cutler
(74) *Attorney, Agent, or Firm* — Tarolli, Sundheim, Covell & Tummino LLP (57) ABSTRACT

The present invention relates to enhancing the image capturing devices, and to enhance the image producing devices, in such a way that they can capture and produce 3D images without the need of any gear to be worn by the viewers. The proposed solution is inspired by ray optics, geometry, mirrors, diamond cuts, eyes, rods & cones of human eyes, and retina design of human eyes. It doesn't "trick" the eyes and brain, it doesn't manipulate the images like current technologies do to give the 3D effect. The invention describes how the light sensors and light emitters, and their layouts to be changed in imaging devices like cameras and TV screens, to capture and produce 3D images, whether or not the directional information can be captured by image sensors and emitters.

7 Claims, 9 Drawing Sheets

(58) Field of Classification Search
CPC ............. H04N 2213/001; H04N 13/20; H04N 13/302; H01L 27/14625; G03B 17/00; G03B 35/08
See application file for complete search history.

(56) References Cited

U.S. PATENT DOCUMENTS

| | | |
|---|---|---|
| 2008/0157244 A1 | 7/2008 | Yun et al. |
| 2009/0135247 A1* | 5/2009 | Busse .................... H04N 23/51 348/46 |
| 2013/0019448 A1 | 1/2013 | Sutton |
| 2016/0163751 A1* | 6/2016 | Sugiyama ......... H01L 27/14618 257/432 |
| 2019/0006401 A1 | 1/2019 | Kim |
| 2019/0246097 A1* | 8/2019 | Lamkin ................ G02B 3/0056 |

* cited by examiner

SVVRON EFFECT: 3D TV AND CAMERA (WITHOUT GLASSES)

FIELD OF THE INVENTION

The present invention relates to the image capturing devices and image producing devices.

BACKGROUND OF THE INVENTION

Currently there is no standard and attractive 3D displays technology in the market which works "without 3D active/passive glasses". There are mainly three types of 3D glasses anaglyph, polarized, and active shutter which are used today. These glasses are bulky, not fit for different face sizes, and are required to be worn by all viewers. These are even more difficult to wear for those viewers who already wear spectacles. Due to these cumbersome glasses, 3D displays are losing traction in the market. Each technology in use today uses different methods to convert and manipulate "flat" images to give 3D appearance on the screens by tricking the eyes and brain. There are a few displays in the market which offer 3D viewing without glass but that's only if you sit exactly in front and center of the TV, and does not quite look 3D. There is no single "standard" that's followed across the industry for 3D displays.

Household cheap mirrors can produce 3D images without any complex circuitry and "without any special glasses".

Then why can't current high-tech displays produce 3D images (without glasses) with complex circuitry?

Where is the gap? What's missing today in all these technologies?

Current Market Available Product's Shortcomings to Produce 3D Images without Glasses.

The actual problem lies in the image emitters and image sensors structure, and their layouts.

Example of image emitters: pixels on TV screens.

Example of image sensors: sensels on charge coupled device in cameras.

Figure 1:
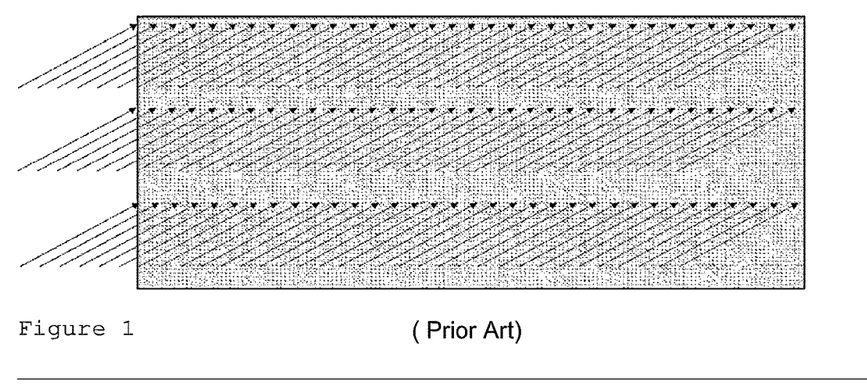
FIG. 1: is a schematic diagram of a conventional way images are captured by imaging devices like camera CCD panels at present. Figure shows a CCD Panel with sensels on CCD placed in rectangular flat mesh layout. Due to this design, angles of the light rays are not captured properly.

Image capturing devices have "flat" or cuboid light sensors which are laid out in a mesh layout, which can't capture angle of light rays falling from various directions on it (Refer FIG. 1). They capture the intensities but not the direction of light rays.

Example of image capturing devices: cameras.

Figure 2:
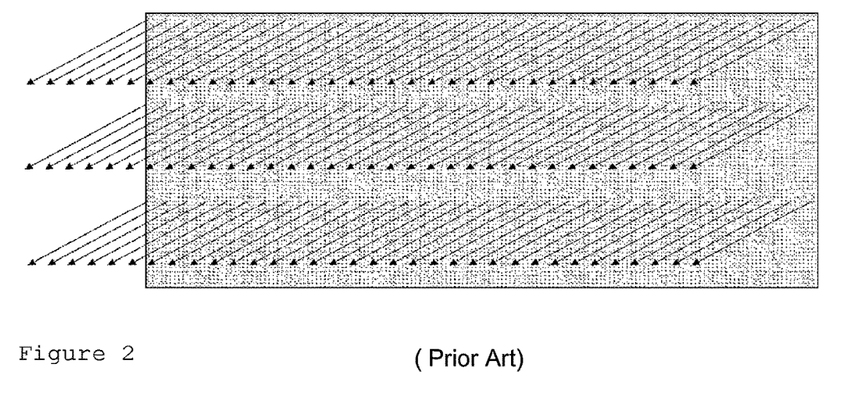
FIG. 2: is a schematic diagram of a conventional way images are produced by imaging devices like TV at present. Figure shows a Flat rectangular mesh panel with Pixels. It primarily sends the light in front direction and angles of the light rays are not reproduced. Whatever light that goes in other directions is also the "same" as what's sent in front direction.

Market available image producing devices have "flat" (or cuboid) light emitters which are laid out in a mesh layout, which send same light rays, with same intensity, in front and all directions, just like in a LED torch light. It doesn't reproduce light rays with different intensities, going out at various angles, in different directions (Refer FIG. 2).

Example of image producing devices: TV screens.

Due to this flat layout, these devices are not able to capture and reproduce the "angles" of the light rays falling on them from various "directions".

In contrast, normal household mirrors reflect light rays falling on it from all "directions" at corresponding various "angles", in all directions, at each point of the mirror.

Figure 3:
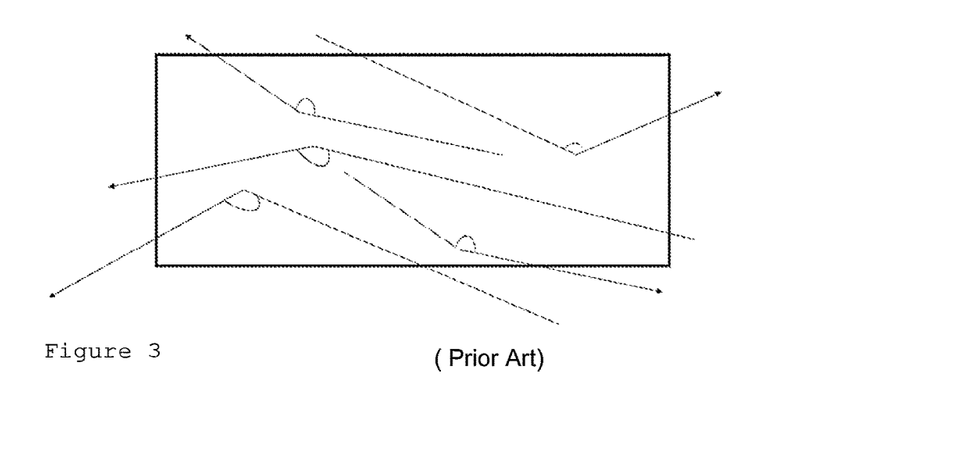
FIG. 3: shows how the light rays are reflected by a simple mirror in all directions at various angles.

Mirrors do not send light in front direction only. When the head and eyes are moved around in a mirror, different light rays falling from different angles is seen, than seen previously when in different position. This simple phenomenon, combined with human binocular vision, helps us see things in 3D on simple mirror (Refer FIG. 3).

BRIEF DESCRIPTION (SUMMARY) OF THE INVENTION

The present invention relates to enhancing the image capturing devices, and to enhance the image producing devices, in such a way that they can capture and produce 3D images just like mirrors, without the need of any special glasses for the viewers.

It describes how the image sensors and light emitters need to be enhanced. It also describes how these should be laid out in imaging devices like camera and TV screen, to produce 3D images from all angles, without requiring the viewers to wear any special gear.

Comparison with Existing Methods

Existing 3D technologies are quite complex, requires anaglyph or active/passive glasses to be worn by the viewers, requires complex image manipulations making image rendering slow. Each viewer has to wear the 3D glasses to view the images and those not wearing the glasses can't see 3D or even 2D images. These are based on "Tricking the eyes and brains".

In contrast, this invention with SVVRONs is inspired by ray optics, geometry, mirrors, diamond cuts, eyes, rods & cones and retina design in human eyes, to produce the 3D images without any cumbersome gear to wear.

BRIEF DESCRIPTION OF THE DRAWINGS/FIGURES

The raised rivet crown head structure with rectangular or hexagonal base is termed as "SVVRON".

It shows light rays captured at various angles by light sensors on sides of SVVRON in image capture devices.

And it shows light rays reproduced at various angles by light emitters on sides of single SVVRON in image producing devices.

Light rays captured by light sensors on sides of the SVVRON, in image capture devices, are emitted by corresponding light emitters on "same" sides of SVVRON in image producing devices.

It shows light rays captured at various angles by light sensors on sides on the single SVVRON with Rectangular or Hexagonal Base in image capture devices.

And it shows light rays reproduced at various angles by light emitters on single SVVRON in image producing devices.

Light rays captured by light sensors on sides of the SVVRON on image capture devices, are emitted from light emitters on the corresponding 'opposite' side of the SVVRON on image producing devices, as if the light has got reflected.

FIG. 30: illustrates a Blocking wall which doesn't let the light rays to pass through.

DETAILED DESCRIPTION OF THE INVENTION

The invention is inspired by ray optics, geometry, mirrors, diamond cuts, eyes, rods & cones in eyes, and retina design of eyes. It doesn't "trick" the eyes and brain. It doesn't manipulate the images the way prevalent technologies do today to give 3D effect to images and videos. It's based on, "What you capture, is what you produce", as seen by the eyes.

The key to produce 3D images without glasses lies in capturing and emitting the light rays coming from different "directions" at various "angles".

Solution of producing 3D images lies in changing the existing pixel's structure and layout design.

And solution of capturing 3D images lies in changing the existing Sensel in CCD panel and their layout.

The raised or protruded rivet crown head structure with rectangular or hexagonal base that is defined in this invention is termed as "SVVRON". SVVRON is an acronym based on the name of the inventors, and doesn't need its full form in this document, hence this is to be treated as a single word throughout the document. Head of the crown, sides of the crown, top of the crown and base of the crown can be of various shapes. Ideal structure, alternate structures, and arrangement patterns for SVVRON have been described in the invention.

Instead of laying out the light sensors and light emitters directly on the image capture and image producing devices, these are to be placed first on SVVRONs and then these SVVRONs need to be laid out on the panels in these devices.

The way images are captured and produced need to be enhanced to produce 3D images. Images need to be captured with "angle" of the rays coming from various "directions" with different intensities, and images need to be produced with "angles" of the rays, so that light rays are sent in all "directions".

There are two ways to achieve this:
Method 1: Use the market available image sensors and emitters, and arrange them in such a way that these can capture and produce 3D images.
Method 2: Change the image sensor elements and image producing elements itself (best case), and arrange them in such a way that these can capture and produce 3D images.
Method 3: Bump or dent the sensor and emitter panel with SVVRON shapes, whether or not the directional information can be captured by image sensors and emitters.

Applying either case 1, 2 or 3, or a combination thereof, to capture 3D images, in the image capture sensor panels is termed as "SVVRON enhanced image capture".

Applying either case 1, 2 or 3, or a combination thereof, to produce 3D images, in the image producer panels is termed as "SVVRON enhanced image produce".

Final Outcome

After changing the consumer and producer designs as mentioned above, desired results can be achieved in following way.

Figure 21:
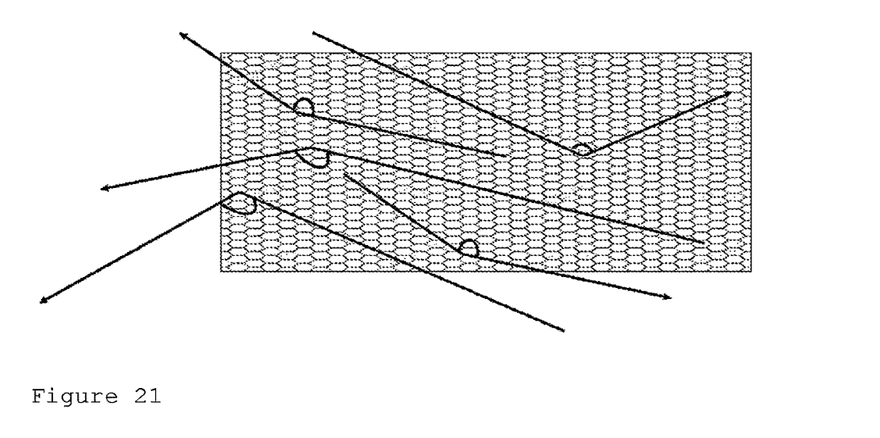
FIG. 21: depicts how the images and videos would be produced by imaging devices with hexagonal based SVVRONs studded with light emitters laid out on image producing panel. Size of the mesh is shown bigger for illustration purpose only. Actual size would be small and indiscernible to the naked eyes.

The final panel should work like as shown in FIG. 21, it'll give the feel that light is coming from different directions at multiple angles.

Figure 22A:
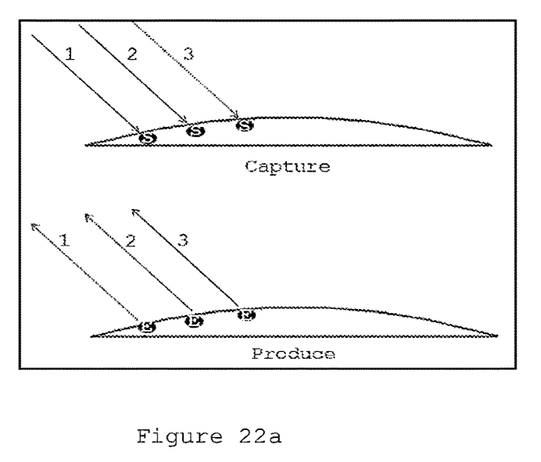
FIG. 22a: illustrates side view of "Case 1: Produce as consumed".
Figure 22B:
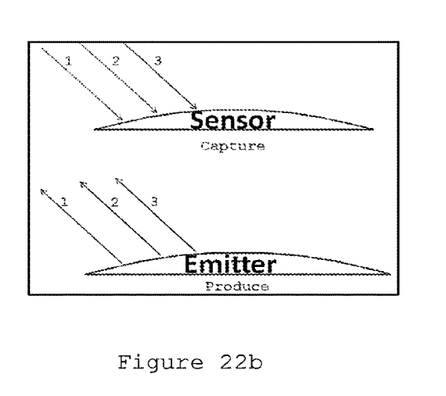
FIG. 22b: similar to FIG. 22a, but with "best case" single SVVRON structured light sensor and emitter.
Figure 23A:
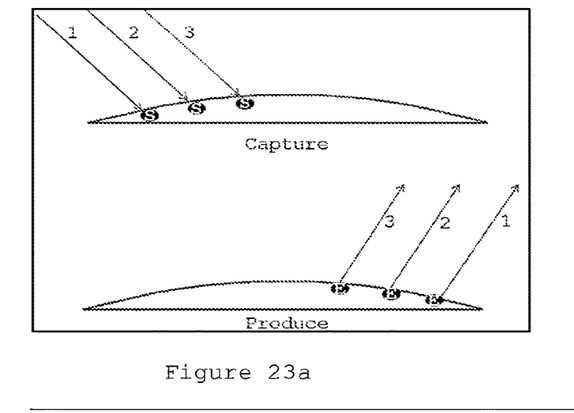
FIG. 23a: illustrates side view of "Case 2: Produce reflected as consumed".
Figure 23B:
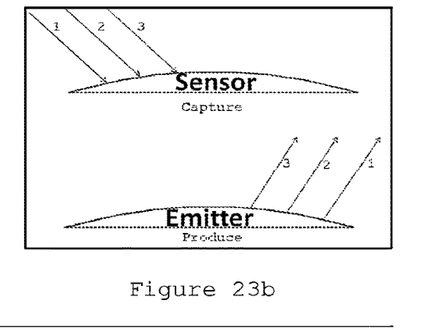
FIG. 23b: similar to FIG. 23a, but with "best case" single SVVRON structured light sensor and emitter.

There are 2 ways in which these SVVRONs can be used while reproducing the captured light:
Case1: Produce as consumed (as shown in FIG. 22)
Case2: Produce reflected as consumed (as shown in FIG. 23)

SVVRON Enhanced Image Capture

In cameras the image capturing need to be like human eyes. Image sensors layout need to be enhanced to capture the "angle" of the rays falling on it from all directions at various angles.

Following "Method 1", instead of laying out the light sensor elements directly on the image capture devices, these are to be placed first on SVVRONs and then these SVVRONs need to be laid out on the panels in these devices in mesh layout.

Instead of laying out light sensor elements on flat surface in flat rectangular mesh, light sensor elements need to be placed around the curved surface on SVVRONs first, to capture light falling on them from all directions, and then these SVVRONs need to be arranged in rectangular or hexagonal mesh structure. These can laid out in rectangular mesh structure on the panels too, if the base chosen for the SVVRON is rectangular, but hexagonal base with hexagonal mesh layout will provide better coverage. Panels are not restricted by mesh structure if it's rectangular or hexagonal or of other shape.

Figure 4:
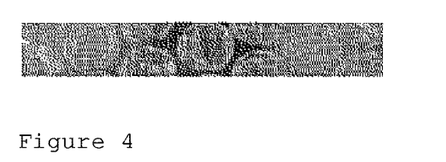
FIG. 4: shows blister packing used in packaging.

This layout can be compared to blister/bubble pack available today. Bubbles can be compared to SVVRONs. Imagine placing multiple light sensor elements on top and sides of each single blister across its surface, on a big blister sheet, instead of placing image sensors directly on flat sheet panel, comparing bubble sheet with light sensor panel (Refer FIG. 4).

Example of a single light sensor element: sensel on CCD.

Individual sensor 'S', on surface of SVVRON can be any existing market available sensor, and can be of any shape.

Figure 5A:
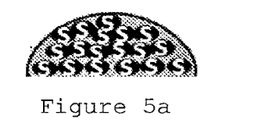
FIG. 5a: illustrates side view of proposed single SVVRON structure as Raised Rivet Crown Head with Rectangular or Hexagonal Base with light sensors placed on surface of it, in all directions. 'S' stands for single light sensor element.
Figure 5B:
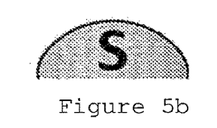
FIG. 5b: illustrates side view of an alternate "best case" single light sensor element structured as SVVRON in shape of Raised Rivet Crown Head with Rectangular or Hexagonal Base, that can capture light at different angles and intensities falling on it from different directions across its curved surface.

Refer FIG. 5a that shows the side view of proposed SVVRON. Each light sensor will capture light falling on it from a particular direction. Thus enabling capturing the angles of the light coming from different direction with different intensities. Each sensor will capture light from one particular direction. More the number of sensors on SVVRONs, more directional information can be captured in smooth manner. Lesser number of light sensors will result in patchy image that may not look smooth.

Key to best image capture with this technique is smaller light sensor size. Smaller the light sensors, more and better it'd fit on SVVRONs, to capture maximum angle of lights from various directions. Smaller the SVVRON size, more SVVRONs can be fitted on the panel. More the number of SVVRONs on the panel, more realistic would be the image captured.

Figure 6A:
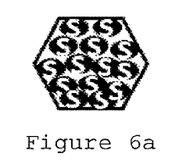
FIG. 6a: illustrates top view of proposed single SVVRON structure as Raised Rivet Crown Head with Hexagonal Base with light sensors placed on it. Each character 'S' in the figure stands for single light sensor element.
Figure 6B:
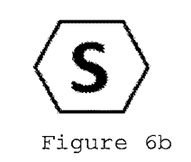
FIG. 6b: illustrates the top view of the "best case" single light sensor element, structured as SVVRON in shape of Raised Rivet Crown Head with Hexagonal Base.

Refer FIG. 6a for the proposed single SVVRON.

Hexagonal base will reduce waste space between adjacent SVVRONs. Round base SVVRON structure would lead to vacant space between the SVVRON.

Figure 7A:
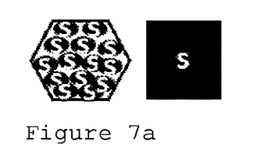
FIG. 7a: shows size comparison of proposed structured as SVVRON with light sensors on it, to an existing single light sensor element.
Figure 7B:
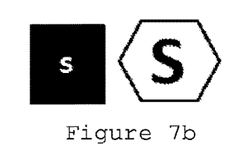
FIG. 7b: shows size comparison of proposed best case light sensor structured as SVVRON, to an existing single light sensor element.

Aim should be to bring the SVVRON size to existing single CCD size or smaller (Refer FIG. 7a).

Figure 8:
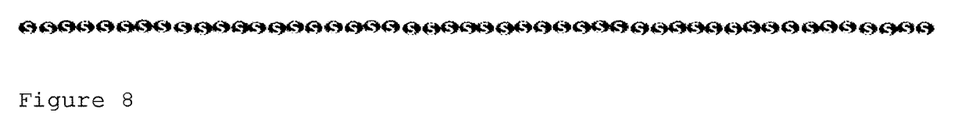
FIG. 8: is a schematic diagram showing side view of a conventional way in which light sensors are arranged currently in flat layout on image capturing devices.

Refer FIG. 8 for the current flat layout in image capturing devices.

Figure 9A:
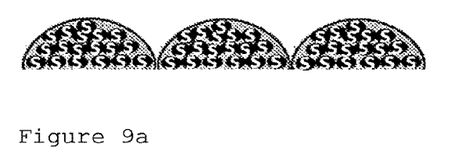
FIG. 9a: illustrates side view of proposed structure SVVRON in shape of Raised Rivet Crown Head with Rectangular or Hexagonal Base with light sensors on it, laid out in image capture devices like camera's CCD panels.
Figure 9B:
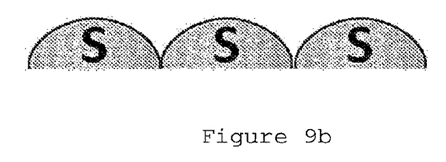
FIG. 9b: illustrates side view of "best case" light sensor elements structured as SVVRON in shape of Raised Rivet Crown Head with Rectangular or Hexagonal Base, laid out in image capture devices like camera's CCD panels.

Refer FIG. 9a for the proposed SVVRON layout on image capture devices.

Figure 10:
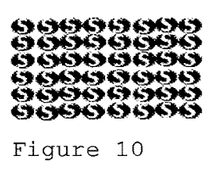
FIG. 10: illustrates top view of small section, of current conventional flat rectangular mesh layout in which light sensor elements are arranged on CCD panels of image capturing devices.

Refer FIG. 10 for the current flat rectangular mesh layout in which light sensors are arranged on image capturing devices.

Figure 11A:
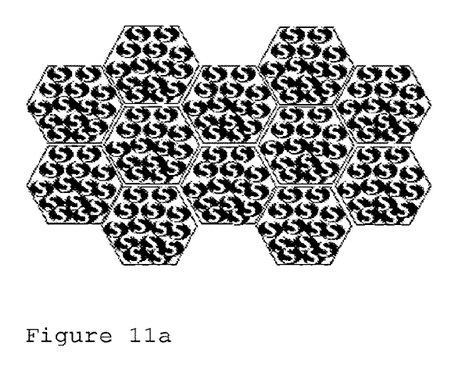
FIG. 11a: illustrates top view of small section, of proposed layout in which SVVRONs with Hexagonal bases, with light sensors on them, to be arranged on light sensor panels of image capture devices.
Figure 11B:
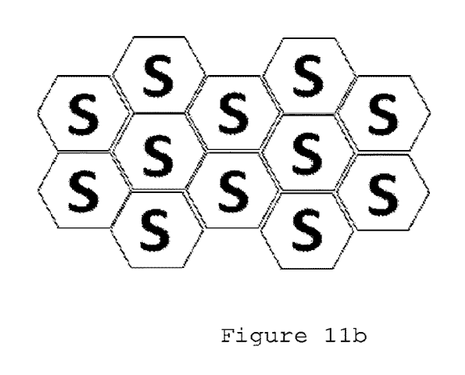
FIG. 11b: illustrates top view of small section, of proposed layout in which "best case" light sensors, structured as SVVRON in shape of Raised Rivet Crown Head with Hexagonal Base, to be arranged on light sensor panels of image capture devices.

Refer FIG. 11a that shows the proposed layout in which SVVRONs to be arranged on image capture devices.

Figure 12:
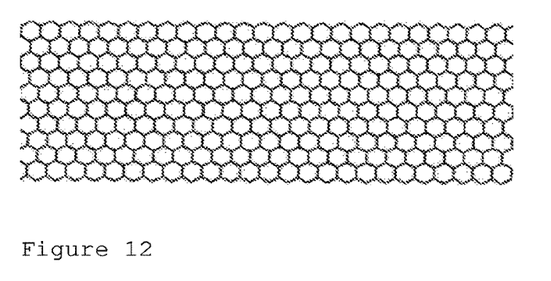
FIG. 12: is a schematic close-up representation of proposed layout, in which SVVRONs need to be arranged, on image capture panels of devices.

Refer FIG. 12 for the proposed panel close-up.

Following Method 2 (ideal case), if the structure of single light sensor itself can be changed as per the above design to SVVRON structure, that can capture the light falling on it from various directions at different angles, then best effects will come (Refer FIGS. 5b, 6b, 9b, and 11b).

In that case instead of placing the light sensors on SVVRON surface, light sensors structured as SVVRON can directly be laid out on the image capture device panels.

Following "Method 3", sensor panels can be bumped or dented with SVVRON shapes to achieve this effect.

SVVRON Enhanced Image Produce

Image producing devices need to be like mirrors to produce images. Image emitters layout need to be enhanced to produce the "angle" of the rays emitted from it in all directions at various angles.

Following "Method 1", instead of laying out the light emitter elements directly on the image producing devices, these are to be placed first on SVVRONs and then these SVVRONs need to be laid out on the panels in these devices in mesh layout.

Instead of laying out light emitter elements on flat surface in flat rectangular mesh, light emitter elements need to be placed around the curved surface on SVVRONs first, to produce light from them in all directions, and then these SVVRONs need to be arranged in rectangular or hexagonal mesh structure. These can laid out in rectangular mesh structure on the panels too, if the base chosen for the SVVRON is rectangular, but hexagonal base with hexagonal mesh layout will provide better coverage. Panels are not restricted by mesh structure if it's rectangular or hexagonal or of other shape.

This layout can be compared to blister/bubble pack available today. Bubbles can be compared to SVVRONs. Imagine placing multiple light emitter elements on top and sides of each single blister across its surface, on a big blister sheet, instead of placing image emitters directly on flat sheet panel, comparing bubble sheet with light emitter panel (Refer FIG. 4).

Example of a single light emitter element: pixel on TV screen panel.

Individual emitter 'E', on surface of SVVRON can be any existing market available emitter, and can be of any shape.

Emitters like Pixels are generally composed of multiple RGB components and may not be circular, here it's shown as single black circular E for simplicity of the figure only.

Figure 13A:
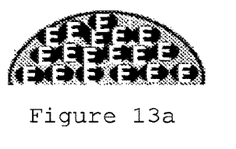
FIG. 13a: illustrates side view of proposed SVVRONs structured as Raised Rivet Crown Head with Rectangular or Hexagonal Base, with light emitters placed on surface of it in all directions. Each character 'E' in the figure stands for single light emitter element.
Figure 13B:
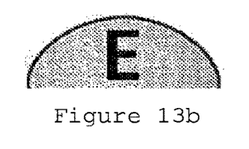
FIG. 13b: illustrates side view of an alternate "best case" single light emitter element structured as SVVRON in shape of Raised Rivet Crown Head with Rectangular or Hexagonal Base, that can produce light at different angles and intensities in different directions across its curved surface.

Refer FIG. 13a that shows the side view of proposed SVVRON. Each light emitter will produce light from a particular direction. Thus enabling producing the angles of the light going in different direction with different intensities. Each emitter will emit light from one particular direction. More the number of emitters on SVVRONs, more directional information can be produced in smooth manner. Lesser number of light emitters will result in patchy image that may not look smooth.

Key to best image produce with this technique is smaller light emitter size. Smaller the light emitters, more and better it'd fit on SVVRONs, to produce maximum angle of lights going in various directions. Smaller the SVVRON size, more SVVRONs can be fitted on the panel. More the number of SVVRONs on the panel, more realistic would be the image produced.

Figure 14A:
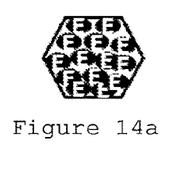
FIG. 14a: illustrates top view of proposed single SVVRON with Hexagonal Base with light emitters placed on it. Each character 'E' in the figure stands for single light emitter element.
Figure 14B:
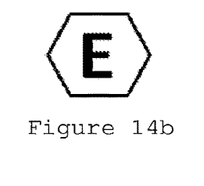
FIG. 14b: illustrates the top view of the "best case" single light emitter element structured as SVVRON with Hexagonal Base.

Refer FIG. 14a for the proposed single SVVRON.

Hexagonal base will reduce waste space between adjacent SVVRONs. Round base SVVRON structure would lead to vacant space between the SVVRON.

Figure 15A:
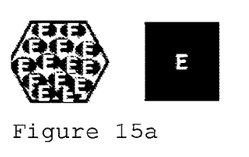
FIG. 15a: shows size comparison of proposed SVVRON to an existing single light emitter element.
Figure 15B:
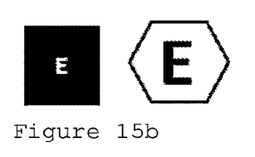
FIG. 15b: shows size comparison of proposed best case light emitter, structured as SVVRON, to an existing single light emitter element.

Aim should be to bring the SVVRON size to existing single pixel size or smaller (Refer FIG. 15a).

Figure 16:
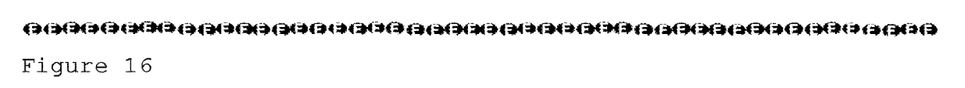
FIG. 16: is a schematic diagram showing side view of a conventional way in which light emitters are arranged currently in flat layout on image producing devices.

Refer FIG. 16 for the current flat layout in image producing devices.

Figure 17A:
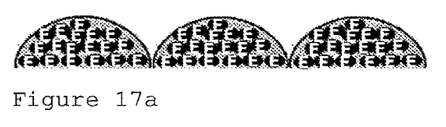
FIG. 17a: illustrates side view of proposed SVVRON structured as Raised Rivet Crown Head with Rectangular or Hexagonal Base with light emitters on it, laid out in image producing devices.
Figure 17B:
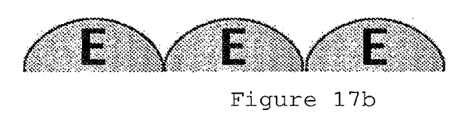
FIG. 17b: illustrates side view of "best case" light emitter elements structured as SVVRON in shape of Raised Rivet Crown Head with Rectangular or Hexagonal Base, laid out in image producing devices.

Refer FIG. 17a for the proposed SVVRON layout on image producing devices.

Figure 18:
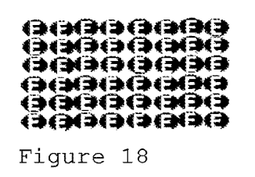
FIG. 18: illustrates top view of current conventional flat rectangular mesh layout in which light emitters are arranged on image producing panels.

Refer FIG. 18 for the current flat rectangular mesh layout in which light emitters are arranged on image producing devices.

Figure 19A:
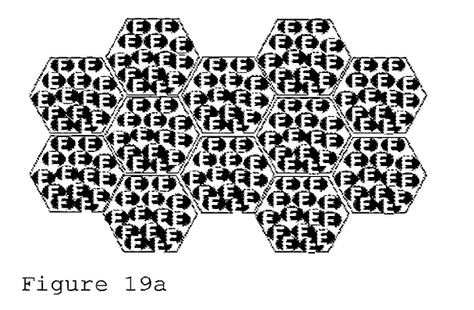
FIG. 19a: illustrates top view of small section of proposed layout in which SVVRONs with Hexagonal Base, with light emitters on them, to be arranged on light emitting panels of image producing devices.
Figure 19B:
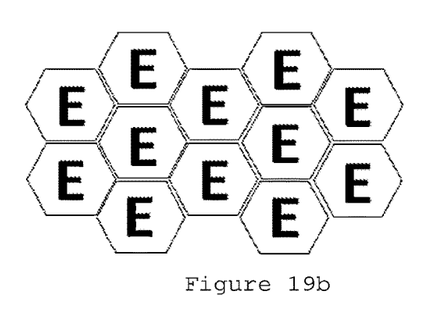
FIG. 19b: illustrates top view of small section of proposed layout in which "best case" light emitters, structured as SVVRONs with Hexagonal Base, to be arranged on light emitting panels of image producing devices.

Refer FIG. 19a that shows the proposed layout in which SVVRONs to be arranged on image producing devices.

Figure 20:
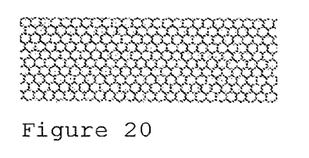
FIG. 20: is a schematic close-up representation of proposed layout in which SVVRONs with hexagonal bases need to be arranged on image display panels.

Refer FIG. 20 for the proposed panel close-up.

Following "Method 2" (ideal case), if the structure of single light emitter itself can be changed as per the above design to SVVRON structure, that can produce the light going out from it in various directions at different angles, then best effects will come (Refer FIG. 13b, 14b, 15b, 17b, and 19b).

In that case instead of placing the light emitters on SVVRON surface, light emitters structured as SVVRON can directly be laid out on the image producing device panels.

Following "Method 3", emitter panels can be bumped or dented with SVVRON shapes to achieve this effect.

Finding the SVVRON Dimensions

Shape of the SVVRON head crown: Shape is such as to capture maximum light with minimum or no loss of light. Least light reflected. And when 1 SVVRON is surrounded by other SVVRONs on all sides, no 2 SVVRONs should block light from each other in image capture devices. And no 2 SVVRONs should emit light so as to be blocked by another SVVRON.

Height of the SVVRON head crown: is dependent on the angle of the SVVRON head crown and its diameter.

Base shape of the SVVRON head: base of the SVVRONs has to be hexagonal like honeycomb structure to fit maximum SVVRONs on image capturing and emitting devices.

Figure 24:
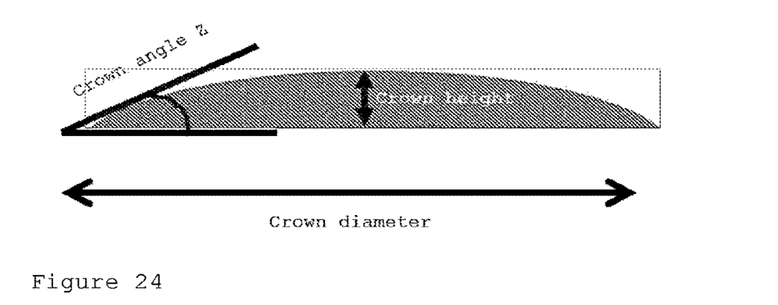
FIG. 24: shows close-up of a proposed SVVRON and its dimensions like crown angle Z, height, and diameter.

Crown angle of the SVVRON head: angles of the SVVRON head can't be sharp, as Field Of View (FOV) need to be considered while coming up with angles. Angles of the SVVRON crown head should be small so that one SVVRON doesn't block the light falling on other SVVRONs (Refer FIG. 24).

SVVRON head angles of image capture devices should match the angles of SVVRON head angle of image producing devices for better reproduction of the image captured.

High and sharp angles will cause light to go beyond visual field of view. And light from one SVVRON will be blocked by another SVVRON.

For image capture devices like cameras, minimum and max SVVRON crown angle depends on the distance of lens from the image capture panel e.g. CCD.

For image producing devices, minimum and max SVVRON crown angle depends on the viewers distance from the screen.

Minimum and maximum SVVRON crown head angle, and its diameter can be adjusted based on the distance of the viewer from the screen, as per horizontal and vertical field of view e.g. mobile devices for close viewing, and big TVs for far viewing.

Figure 25:
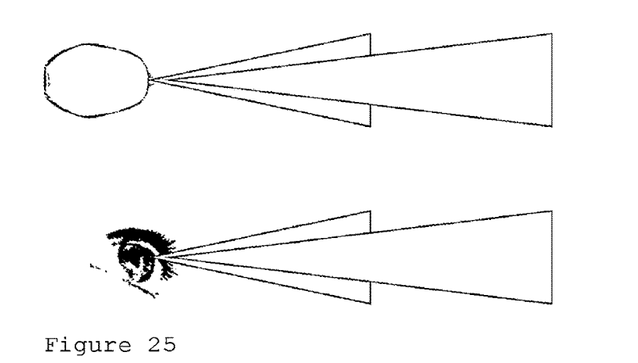
FIG. 25: shows the horizontal and vertical field of view.
Figure 26:
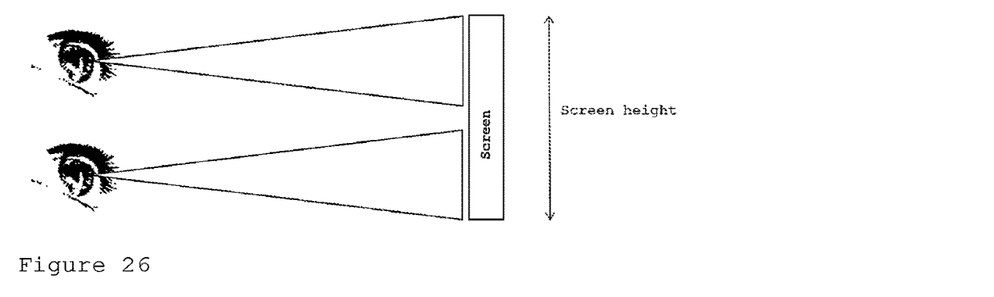
FIG. 26: illustrates vertical eye movement across the screen, along with head movement, within screen limits.

Angle selected should be such that a person viewing from front center gets maximum light and similarly person at front last corner of the screen also get the max light (refer FIG. 25 and FIG. 26).

Figure 27:
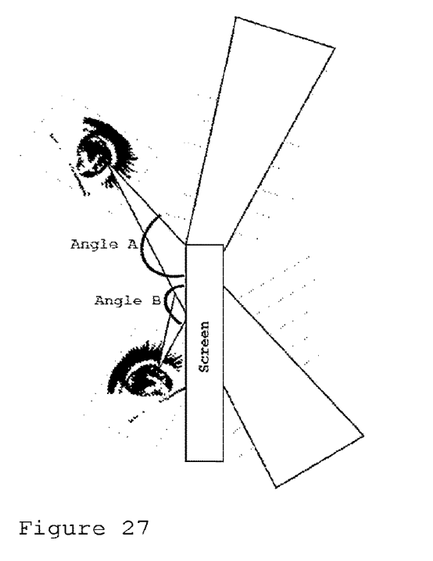
FIG. 27: illustrates vertical eye movement across the screen in extreme cases, along with head movement.

Refer FIG. 27 that shows the angles made by light rays when eyes are moved vertically across the screen in extreme cases.

Angle A & B can be kept same for symmetric design. Light going beyond these angles will not be visible to the eyes. Hence emitting light beyond these angles will not be useful. This helps in finding the optimal angle of the SVVRON crown head.

Figure 28:
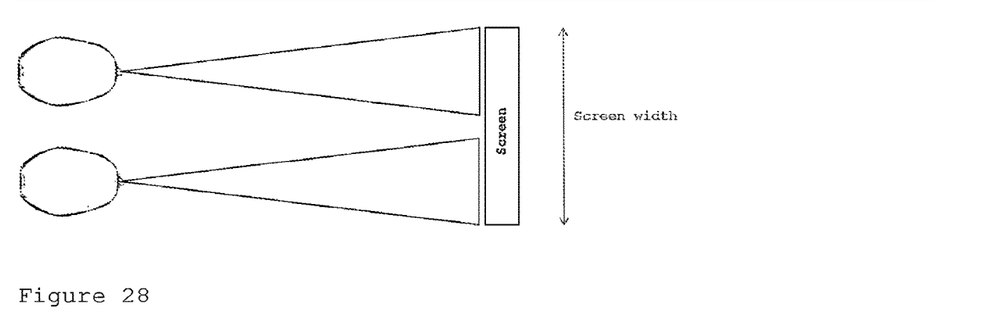
FIG. 28: illustrates eye movement across the screen with head movement.

Refer FIG. 28 that shows the head movement across the screen.

Figure 29:
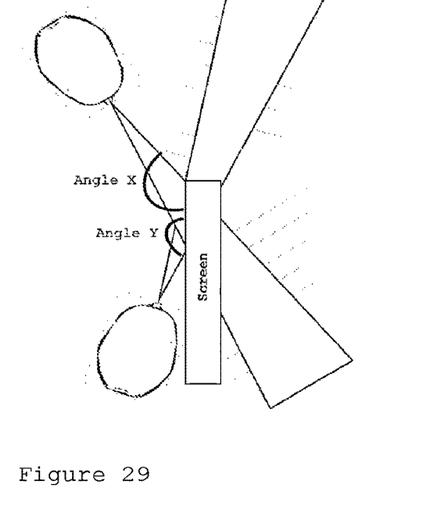
FIG. 29: illustrates horizontal eye movement across the screen in extreme cases with head movement.
Figure 30:
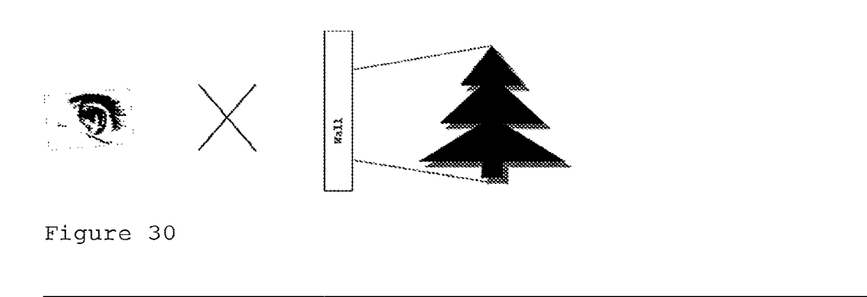

Refer FIG. 29 that shows the angles made by light rays when head is moved horizontally across the screen in extreme cases.

Angle X & Y can be kept same for symmetric design. Light going beyond these angles will not be visible to the eyes. Hence emitting light beyond these angles will not be useful. This helps in finding the optimal angle of the SVVRON crown head.

Angle Z (crown head angle) of SVVRON should be such that it can send rays at all angle X or Y, or A, or B in all directions, without being obstructed by another SVVRON. It should not send rays beyond angle A, B, X, Y.

Since the SVVRON structure is symmetrical, all angles A, B, X, & Y are to be kept same to derive SVVRON head crown angle Z, as viewer can view from any direction. And directions are not to be differentiated.

Maximum angle at which rays can be viewed by the viewer A, B, X, Y are also dependent on angle Z.

If binocular vision horizontal field of view angle is taken approximately as 60 degree and vertical field of view angle as 50 degree. Keeping the minimum of these two (50 degree) and considering max horizontal and vertical head movement as same, and considering the edge cases where eyes are close to max viewing angle of the screen. Crown angle can be 15 degree.

3D Contents for Viewers

There are 2 types of contents that are being used in industry today:
1. Captured via camera
2. Produced via software The $1^{st}$ method was discussed above.

For $2^{nd}$ method: Software support to produce contents, which are not captured via camera, can also be made available fast. 3D gaming technologies already have software for ray tracing and they can fast adapt and enhance their games to this technology, to produce 3D contents without requiring specific glasses to be worn by the viewers.

Limitations and Remediation

This technique will work to display images which will look 3D "inside" the device, not outside i.e. it will not produce protruding 3D images. 3D images would be like the way it's seen in mirrors, images don't seem to come out of the mirrors.

Since this technique is based on light emitters, this technique can't be used in projectors which throw light on static screens.

To produce images protruding out of display, this technique can be combined with existing 3D technologies to produce stunning effects beyond imagination, and it'd lead to better 3D Holograms Technologies.

Future Enhancements
1. The CCD panels of cameras are generally flat and straight, it can be curved like human eyes like retina wall, to capture the light better.
2. Projector companies using DLP technology can augment this technology as they understand light reflections better.
3. Fighter jet companies working on stealth technologies have labs to understand the rays at various directions and they can augment this technology.
4. Futuristic 3D hologram projector companies can leverage from this design.
5. 3D Scanner technology can be used to further augment the camera design.
6. Graphene and black phosphorus can be used to better enhance the light sensors and emitters.
7. Image sensors in the shape of nano-cylinders can be used on surface of SVVRONs for better light sensitivity.
8. It can be enhanced further to produce images protruding out of the screens.

Business Opportunities

Today the TV and mobile market has saturated, stagnated, and sales of these devices is not picking up. People who already have mobiles and TVs currently have no reason to buy new devices.

With this new SVVRON technology, camera, mobile, medical imaging devices, and TV makers can push the sales of new devices with this attractive feature to new as well as old customers.

Existing image sensors and Pixels technologies can be reused as per above design, hence no big bang change is required by these manufacturing companies to their existing capabilities and infrastructure to launch this new feature.

Existing 3D software with minor changes can be readily used for contents in the market.

Applications and Usages
  Screens of Mobile Phones
  Screens of Tablets
  Screens of Laptops
  Screens of Desktops
  Cameras
  Screens of Cameras
  TV Screens
  Watch screens
  Screens of medical imaging devices
  Invisibility/camouflage cloaks
  3D holographic projectors
  Invisible walls (described below)
  Airplane without glass windshields and windows (described below)
  Camouflage technologies
  Video games
  Augmented reality
  3D holographic projectors Invisible Wall (which can Conceal Anything Inside it, from Bricks to Cars and Trucks)

Currently the way images are reproduced is, by camera having lens capturing the light on CCDs and later reproducing via screen Pixels. Size of the CCD panels is much smaller.

If instead of following this lensed approach, if images are captured directly by CCDs without lenses and box structure, and the sensels on CCDs are mapped to Pixels in 1:1 ratio, by placing CCDs on one side of the wall and Pixels on other side of the wall, invisible wall effect can be achieved as explained below.

Figure 31:
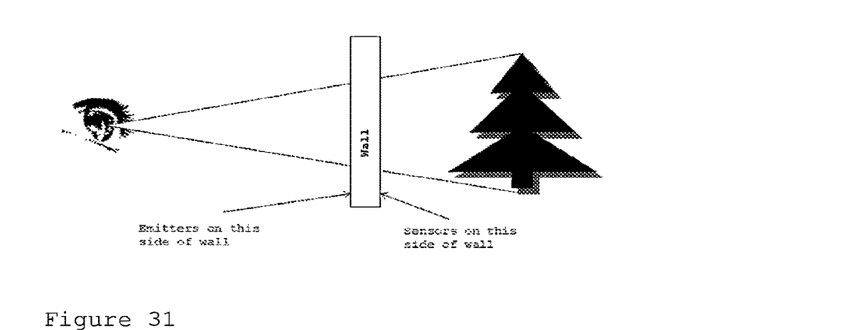
FIG. 31: illustrates an Invisible wall, where the items on the other side of the wall can be seen.

Objects on other side of the wall can't be seen because the light emitted or reflected by that object is blocked by the intermediary objects, wall in this case, and since the light doesn't reach cur eyes, the object can't be seen (Refer FIG. 31).

Figure 32:
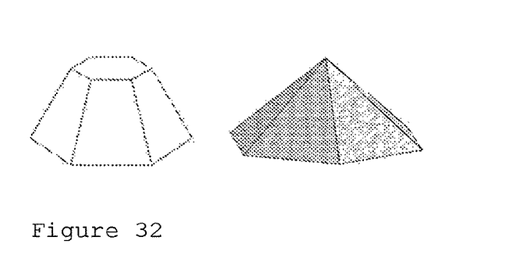
FIG. 32: illustrates two more alternate structures of the SVVRON.

If SVVRON based CCD panel is placed on one side of the wall and SVVRON based pixel panel is placed on other side of the wall with 1:1 mapping between these SVVRONs, then the light emitted or reflected by that object will fall on SVVRON based CCDs panel and same light can be reproduced on other side of the wall by the SVVRON based light emitters placed on it. That way eyes can see the objects on other side of the wall as if the wall was never there (Refer FIG. 32).

Following same theory, one side of any vehicle (or any other object) can be applied with such SVVRON enhanced CCDs on one side of it, and SVVRON enhanced pixels on other side of it to make it look invisible from one side.

If the same panel on each side of the vehicle (or any other object) can be studded with both SVVRON enhanced CCDs and SVVRON enhanced pixels interlaced, then invisible appearance can be achieved from both sides of the vehicle.

CCDs and pixels available today can't achieve the same feat without SVVRON technology, because they can't produce the 3D effect and would look just like normal TV.

Airplane without Glass Windshields and Windows

Glass currently poses the size and shape restriction on the Airplane windshield. Due to glass, windshields and windows of a plane are flat and small. With SVVRON technology, metal windshields can be used of any size and shape.

Similar to above invisible wall, same concept can be used to replace the "glass" windshield of the Airplane with bigger "metal" windshield, with SVVRON enhanced light capture panels on front side, and SVVRON enhanced light producing panels on the cockpit side of the "metal" windshield.

In similar way Airplane windows can also be made of any shape and size.

Alternate SVVRONs Structures

Alternate for rounded rivet crown head structure is, faceted design of the crown head. Faceted Structures can be of Trapezoidal, Triangular, and Lozenge shapes.

In addition to these facets, there can be multiple slanted layers at slight angle difference between them, starting from 15° and difference of 5° each between each layer.

Figure 33:
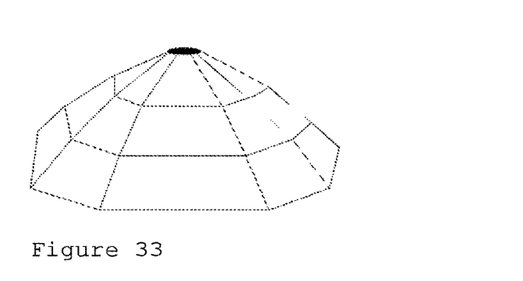
FIG. 33: represents 3rd alternate structure of the SVVRON with flat top and Trapezoidal Facets.

FIG. 33 shows two other alternate SVVRON structures.

Size of each facet: Same as size of the light emitter element. Smaller the size of the pixel, smaller is the size of the facet.

Total number of facets: there should be even number of total facets on each side strip of the SVVRON, and one flat facet on top of the SVVRON. Even number of facets should be there, so that each facet has corresponding opposite side facet. If light sensor element captures light on one facet of the SVVRON, then it will be reproduced by corresponding light emitter element on opposite facet of the SVVRON in the image display panel. It will produce light reflection effect. One flat facet on top of the SVVRON to capture and produce the light falling directly perpendicular to it, the way existing camera and TVs do it.

Total number of sensors or emitters on the SVVRON: Even number of total sensors or emitters on the SVVRON's side surfaces, and few pixels, even or odd based on how many can fit, on top of the SVVRON to send light in straight front direction. Even number of sensors or emitters on sides, so that each sensors or emitters has corresponding diagonally opposite sensor or emitter on diagonally opposite side of the SVVRON. More pixels should send light in front direction.

Number of facets from bottom to top in one side of the SVVRON: as many as possible, that can start from the 15 degree and finally ending in 0 degree crown angle.

Number of image sensors on each facet: One image sensor on each facet. Smaller the image sensor, more facets can be supported. Instead of putting more image sensors on a single facet, prefer to have more facets on the side of the crown.

Figure 34:
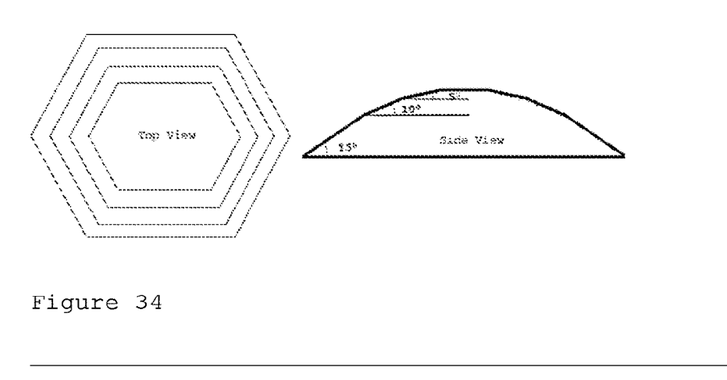
FIG. 34: represents 4th alternate structure of the SVVRON with facets and flat top.

FIG. 34 shows 3$^{rd}$ alternate structure of the SVVRON with flat top and Trapezoidal Facets.

Figure 35:
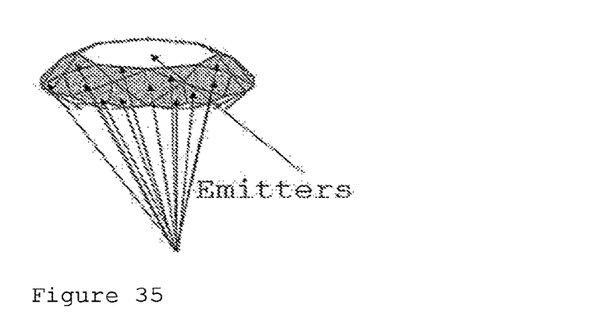
FIG. 35: represents 5th alternate structure of the SVVRON. Multiple light emitters can be there on its top flat surface and one light emitter on each facet if the facet is small. If facets are big then multiple light emitters can be there on each facet.

FIG. 35 represents 4th alternate structure of the SVVRON.

Other alternate SVVRON structures can be inspired by:
Geodesic domes of classes V1, V2, V3
Dodecahedron and icosahedron structures
Cues can be taken from Diamond cuts also. Refer FIG. 36 that represents 5th alternate structure of the SVVRON head design.

Alternate SVVRON structures can be inspired by diamond "crown" cuts like:
Step cut
Point Cut
Table cut
Old European cut
Rose cut
Round brilliant cut
Mirror cut
Burgundian Point (dodecahedron)

Structure chosen is very much dependent on the size of the facets. Smaller the facets, the better it is. Smaller facets cover more directions and will have smoother edges.

The invention claimed is:

1. An apparatus for capturing 3D images, comprising:
   an image capture panel;
   a plurality of SVVRON structures laid on the image capture panel, each of the plurality of SVVRON having a head crown and a hexagonal base; and
   a plurality of light sensors disposed on each of the plurality of SVVRON structures,
   wherein height of the head crown of each of the plurality of SVVRON structures is dependent on an angle of disposition of the SVVRON head crown and diameter of SVVRON head crown, and wherein the minimum and the maximum SVVRON crown angle is based on distance of lens of the apparatus for capturing 3D images from the image capture panel of the apparatus.

2. The apparatus of claim 1, wherein the plurality of light sensors are mounted on a curved surface of each of the plurality of SVVRON structures.

3. The apparatus of claim 1, wherein the crown angles of the plurality of SVVRON are configured such that a SVVRON structure does not block the light falling on adjacent SVVRON structures.

4. The apparatus of claim 1, wherein the plurality of SVVRON structures are arranged in a hexagonal mesh pattern on the image capture panel.

5. An apparatus for producing 3D images, comprising:
   a light-emitting panel;
   a plurality of SVVRON structures laid on the light-emitting panel, each of the plurality of SVVRON having a head crown and a hexagonal base; and
   a plurality of light emitters disposed on each of the plurality of SVVRON structures,
   wherein height of the head crown of each of the plurality of SVVRON structures is dependent on an angle of disposition of the SVVRON head crown and diameter of SVVRON head crown, and wherein the minimum and the maximum SVVRON crown angle is based on viewer's distance from screen of the apparatus for producing 3D images.

6. The apparatus of claim 5, wherein the plurality of light emitters are mounted on a curved surface of each of the plurality of SVVRON structures.

7. The apparatus of claim 5, wherein the plurality of SVVRON structures are arranged in a hexagonal mesh pattern on the light-emitting panel.

* * * * *